(12) United States Patent
Nagase et al.

(10) Patent No.: US 6,711,511 B2
(45) Date of Patent: Mar. 23, 2004

(54) ELECTROMAGNETIC WAVE ANALYZING APPARATUS AND COMPUTER READABLE STORAGE MEDIUM

(75) Inventors: Kenji Nagase, Kawasaki (JP); Shinichi Ohtsu, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 262 days.

(21) Appl. No.: 09/811,524

(22) Filed: Mar. 20, 2001

(65) Prior Publication Data

US 2002/0019713 A1 Feb. 14, 2002

(30) Foreign Application Priority Data

Jul. 6, 2000 (JP) .......................................... 2000-205639

(51) Int. Cl.⁷ ............................................. G01R 25/00
(52) U.S. Cl. ........................................ 702/65; 324/750
(58) Field of Search ................................ 702/64–71, 86, 702/94–95, 124, 150, 189–190; 324/750–753, 763–765; 703/3–4, 14, 22

(56) References Cited

U.S. PATENT DOCUMENTS

| | | | | |
|---|---|---|---|---|
| 5,519,320 A | * | 5/1996 | Kanayama et al. | 324/309 |
| 5,764,116 A | * | 6/1998 | Ishikawa et al. | 333/202 |
| 5,812,434 A | * | 9/1998 | Nagase et al. | 703/2 |
| 5,825,331 A | * | 10/1998 | Lee | 343/703 |
| 6,129,459 A | * | 10/2000 | Kishimoto et al. | 703/5 |
| 6,185,517 B1 | * | 2/2001 | Ohtsu et al. | 703/4 |
| 6,304,677 B1 | * | 10/2001 | Schuster | 382/264 |
| 6,320,378 B1 | * | 11/2001 | Maier et al. | 324/307 |
| 6,507,795 B2 | * | 1/2003 | Namiki | 702/66 |
| 6,534,982 B1 | * | 3/2003 | Jakab | 324/318 |

FOREIGN PATENT DOCUMENTS

| JP | 6-309420 | 11/1994 |
|---|---|---|
| JP | 11-64412 | 3/1999 |

OTHER PUBLICATIONS

Huang et al., "Line and Net Pattern Segmentation Using Shape Modeling", Jun. 25, 2002, Arizona State University.*

* cited by examiner

Primary Examiner—Marc S. Hoff
Assistant Examiner—Mary Catherine Baran
(74) Attorney, Agent, or Firm—Staas & Halsey LLP

(57) ABSTRACT

An apparatus analyzing electromagnetic waves radiated from an appliance using a net pattern of the appliance and having a coordinates data extracting unit extracting, from net pattern information, coordinates data defining the coordinates of each of terminal points of a plurality of segments constituting the net pattern; and a smoothing unit for dividing the net pattern, based on the extracted coordinates data, into plural object sections, each of a length not greater than a predetermined maximum length, and smoothing the net pattern for each object section, by replacing plural segments in each object section with a single, or a plurality of, straight lines smaller in number than the number of the segments. The electromagnetic field intensity of the electromagnetic waves is calculated on the basis of coordinates data for which smoothing is completed.

19 Claims, 11 Drawing Sheets

Fig.7
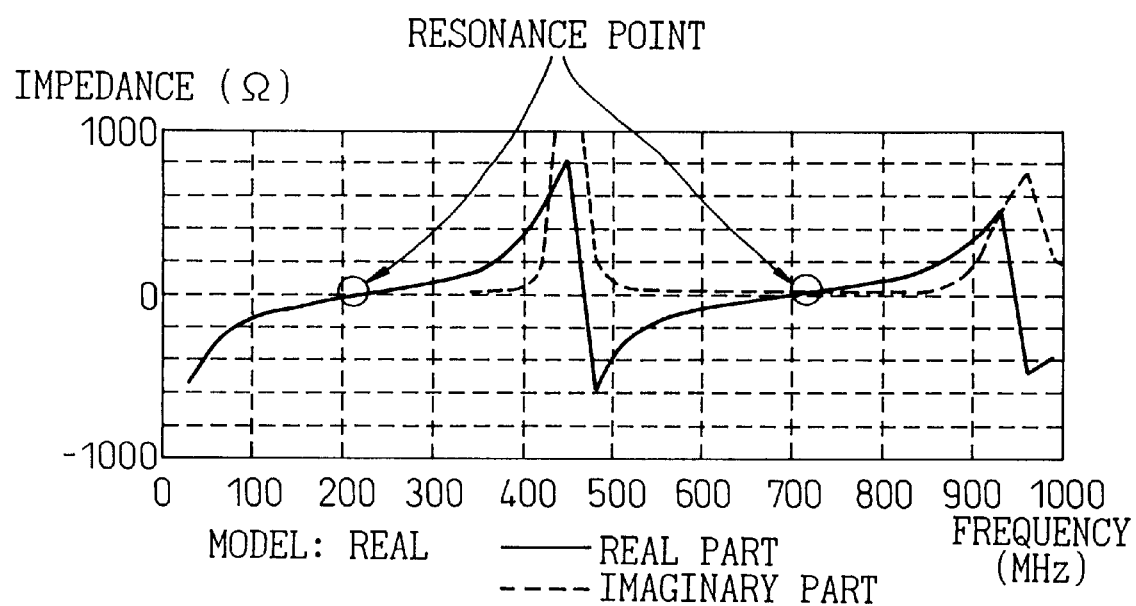
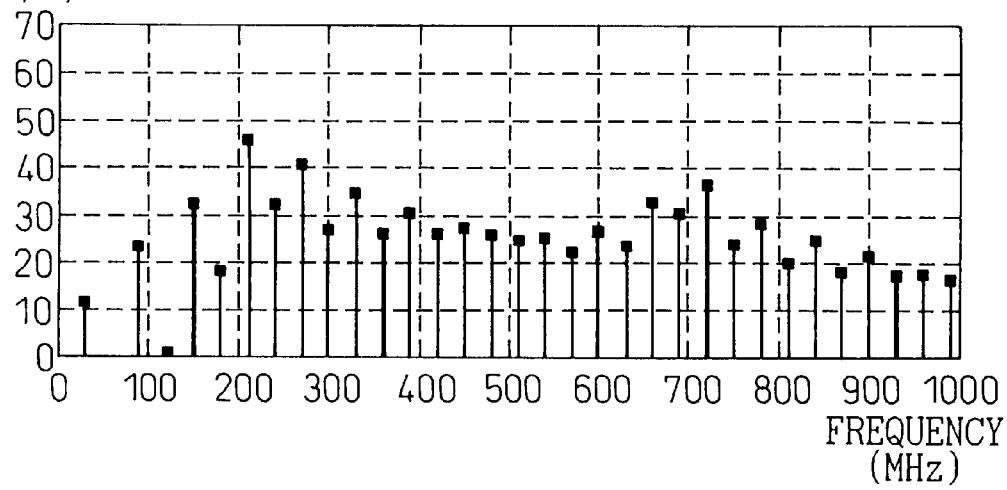

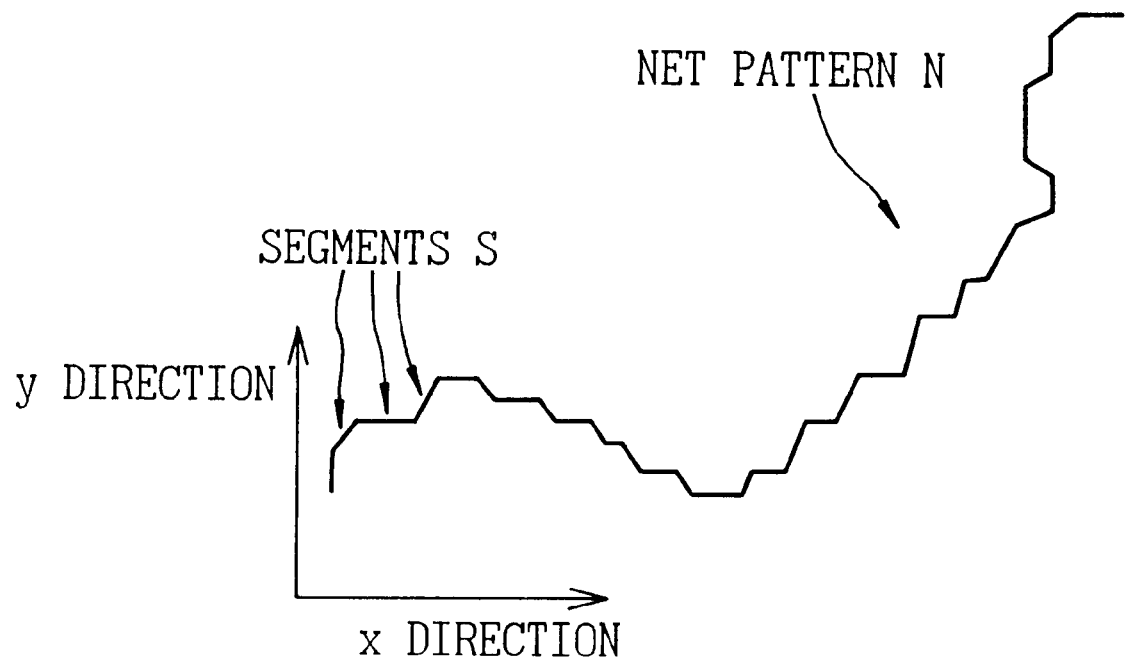

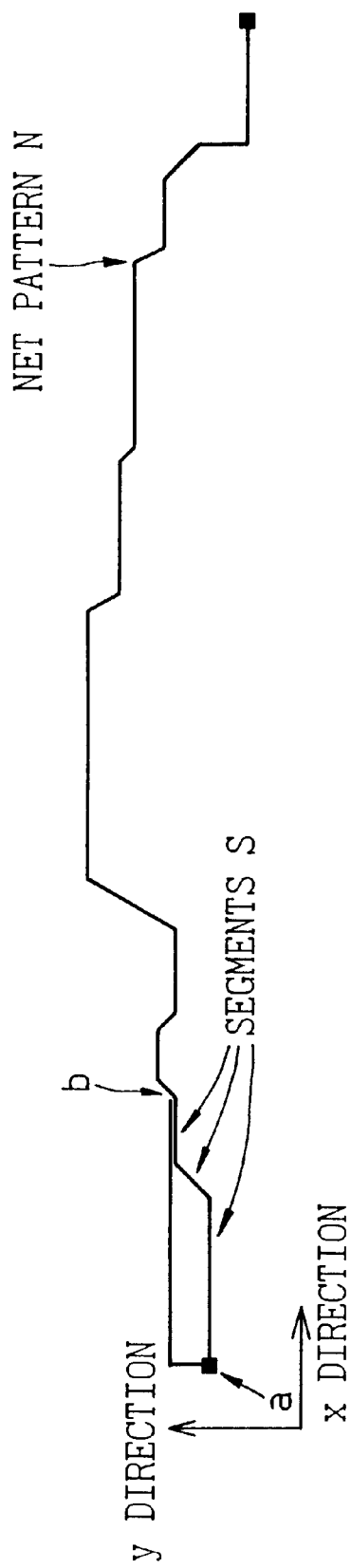

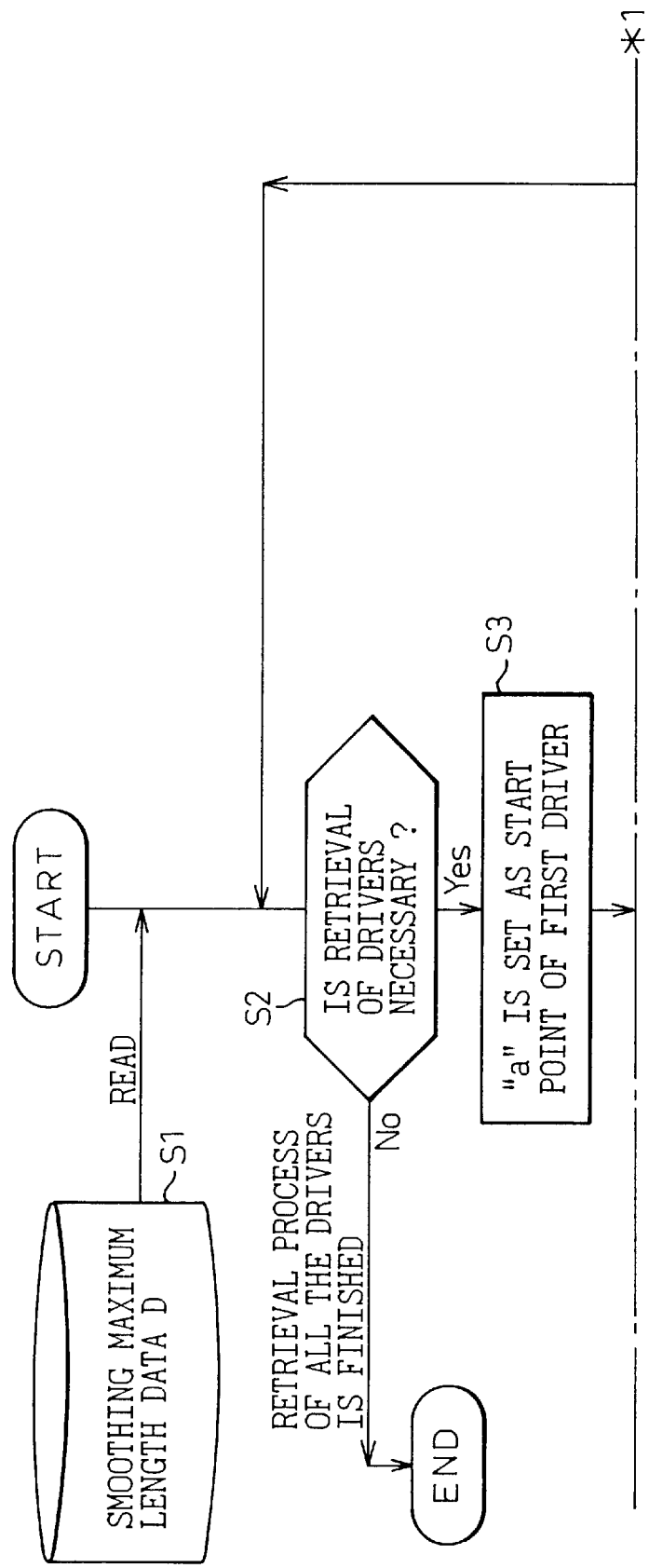

ELECTROMAGNETIC WAVE ANALYZING APPARATUS AND COMPUTER READABLE STORAGE MEDIUM

BACKGROUND OF THE INVENTION

1. Field of the Invention

The present invention relates to an electromagnetic wave analyzing apparatus for analyzing the electromagnetic field intensity, etc. of an electromagnetic wave radiated from an electronic apparatus or the like, based on net pattern information concerning a net pattern obtained by modeling the electronic apparatus or the like under analysis (electromagnetic waves existing within a specific frequency range are called "radio waves"). The invention also relates to a computer readable storage medium for the same.

EMC (electromagnetic compatibility) rules tend to become more stringent year by year, imposing severer restrictions on the electromagnetic field intensity of electromagnetic waves that various appliances such as electronic apparatuses are allowed to radiate when put in operation as products. It is therefore a pressing issue to take measures to cope with the electromagnetic waves that such electronic apparatuses radiate. As one of the measures to cope with this issue, it is becoming important to form a plurality of net patterns by modeling an appliance such as an electronic apparatus by means of a simulation technique, and to calculate rapidly and accurately the electromagnetic field intensity, etc. of electromagnetic waves generated within each of these net patterns, by using electromagnetic wave analyzing software as a tool.

2. Description of the Related Art

When analyzing an electromagnetic wave radiated from an appliance such as an electronic apparatus, if information about the arrangement of net patterns is acquired as net pattern information from a CAD (computer aided design) system, a model for electromagnetic wave analysis can easily be constructed by modeling the above appliance. The information about the arrangement of net patterns referred to here represents information showing positions in which electronic components within the electronic apparatus are mounted.

To facilitate understanding of a problem associated with a prior art electromagnetic wave analyzing method, one example of the prior art electromagnetic wave analyzing method will be described below, with reference to FIG. 1 that will be described later in "BRIEF DESCRIPTION OF THE DRAWINGS".

A schematic diagram showing one example of a prior art net pattern used for electromagnetic wave analysis, is illustrated in FIG. 1.

Generally, by modeling an electronic apparatus for electromagnetic wave analysis, a net pattern N, as shown in FIG. 1, is obtained. It should be noted that one of a plurality of net patterns is typically shown as the net pattern N in FIG. 1. In an actual electronic apparatus, since various electronic components are mounted at high density on a printed circuit board, the space for a wiring of the components tends to be reduced, and the net pattern has to be bent at small pitches or small distances. As a result, the net pattern N is usually made up of many segments (also called line segments) S and terminal points P connecting adjacent segments with each other. Some of these terminal points P may also includes branching points each for branching one segment into two or more segments. When analyzing the electromagnetic field intensity, etc. of electromagnetic waves in such a net pattern, since each of these segments is calculated as one element which generates a radiation of the electromagnetic waves, the time required to analyze the electromagnetic waves tends to increase as the number of segments increases.

As described above, according to the prior art, when analyzing electromagnetic waves in a plurality of net patterns established for an electronic apparatus or the like, it has been necessary to calculate the electromagnetic field intensity, etc. of the electromagnetic waves radiated from each of the segments in the net patterns.

Since there are usually approximately 100 to 200 kinds of net patterns on each of the printed circuit boards mounted in an electronic apparatus, the time required for such an analysis becomes correspondingly longer.

Besides, there are cases in which data of six kinds of net patterns involve approximately 1500 segments, as reported in one example; in such cases, it takes as many as 40 hours to complete the calculation for such net pattern data.

In other words, if information about the arrangement of net patterns established based on the mounting positions of various electronic components on a printed circuit board is directly used as net pattern information from a CAD system, the total number of segments will become very large and an enormous amount of time will be required for the analysis of electromagnetic waves radiated from an electronic apparatus or the like.

SUMMARY OF THE INVENTION

The present invention has been devised in view of the above problem, and it is an object of the present invention to provide an electromagnetic wave analyzing apparatus that can reduce the time required for electromagnetic wave analysis as much as possible without affecting the accuracy of the electromagnetic wave analysis, and also to provide a computer readable storage medium for use in the electromagnetic wave analyzing apparatus. The term "computer readable storage medium" used herein means a storage medium from which data can be read out by using a computer.

To achieve the above object, the electromagnetic wave analyzing apparatus of the present invention includes an electromagnetic wave analyzing unit for analyzing electromagnetic waves radiated from an appliance, on the basis of net pattern information concerning a net pattern obtained by modeling the appliance under analysis, and comprises a coordinates data extracting unit for extracting, from the net pattern information, coordinates data defining the coordinates of each of terminal points of a plurality of segments constituting the net pattern; and a net pattern smoothing unit for dividing the net patterns, based on the coordinates data extracted by the coordinates data extracting unit, into object sections each containing a prescribed number of segments so that the length of each of the object sections is not greater than a predetermined maximum length, and for carrying out smoothing of the net pattern for each object section, by replacing the prescribed number of segments contained in the object section with a single straight line or a plurality of straight lines smaller in number than the number of the segments.

The electromagnetic wave analyzing apparatus of the above configuration is constructed so that the coordinates data for which the smoothing has been completed is input to the electromagnetic wave analyzing unit for calculation of the electromagnetic field intensity of the electromagnetic waves.

Preferably, in the electromagnetic wave analyzing apparatus of the present invention, the net pattern smoothing unit carries out the smoothing for the each object section by selecting an arbitrary intermediate point located between coordinates defining a start point of the object section and coordinates defining an end point thereof, and by setting the coordinates of the intermediate point so that the sum of the distance between the start point and the intermediate point and the distance between the intermediate point and the end point is equal to the combined length of the prescribed number of segments contained in the object section, and the coordinates data containing the coordinates of the start point, intermediate point, and end point of the object section, for which the smoothing has been completed, is input to the electromagnetic wave analyzing unit.

Further, preferably, in the electromagnetic wave analyzing apparatus of the present invention, the net pattern smoothing unit carries out the smoothing for each object section, by replacing the prescribed number of segments contained in the object section with a straight line joining the start point and end point of the object section, and the coordinates data containing the coordinates of the start point and end point of the object section, for which the smoothing has been completed, is input to the electromagnetic wave analyzing unit.

Further, preferably, in the electromagnetic wave analyzing apparatus of the present invention, the net pattern smoothing unit carries out the smoothing for each object section, by replacing the prescribed number of segments contained in the object section with two straight lines consisting of a first directional component and a second directional component joining the start point and end point of the object section, and the coordinates data containing the coordinates of the start point and end point of the object section, for which the smoothing has been completed, is input to the electromagnetic wave analyzing unit.

The present invention also provides a computer readable storage medium used for analyzing electromagnetic waves radiated from an appliance, on the basis of net pattern information concerning a net pattern obtained by modeling the appliance under analysis, the storage medium having stored therein means for extracting, from the net pattern information, coordinates data defining the coordinates of each of terminal points of a plurality of segments constituting the net pattern; means for dividing the net pattern, based on the extracted coordinates data, into object sections each containing a prescribed number of segments so that the length of each of the object sections is not greater than a predetermined maximum length, and for carrying out smoothing of the net pattern for each object section, by replacing the prescribed number of segments contained in the object section with a single straight line or a plurality of straight lines smaller in number than the number of the segments; and means for calculating the electromagnetic field intensity of the electromagnetic waves, on the basis of the coordinates data for which the smoothing has been completed.

In summary, in the present invention, since the number of segments can be reduced by carrying out the smoothing of the net pattern without substantially affecting the accuracy of electromagnetic wave analysis, the time required for the analysis of electromagnetic waves can be drastically reduced without degrading the accuracy of the electromagnetic wave analysis.

BRIEF DESCRIPTION OF THE DRAWINGS

The above object and features of the present invention will be more apparent from the following description of the preferred embodiments with reference to the accompanying drawings, wherein:

FIG. 7 is a graph showing the relationship between the impedance and electric field intensity of the net pattern;

FIG. 8 is a schematic diagram showing how the net pattern applied to the embodiment of the present invention is decomposed into x directional and y directional components;

FIG. 9 is a schematic diagram showing how a third smoothing process is carried out on the net pattern applied to the embodiment of the present invention; and FIGS. 10(A) and 10(B) are flowcharts each for explaining a procedure for carrying out the smoothing process according to the embodiment of the present invention.

DESCRIPTION OF THE PREFERRED EMBODIMENTS

The configuration and operation of a basic embodiment and a preferred embodiment according to the present invention will be described below with reference to the accompanying drawings (FIGS. 2 to 10(B)).

Figure 2:
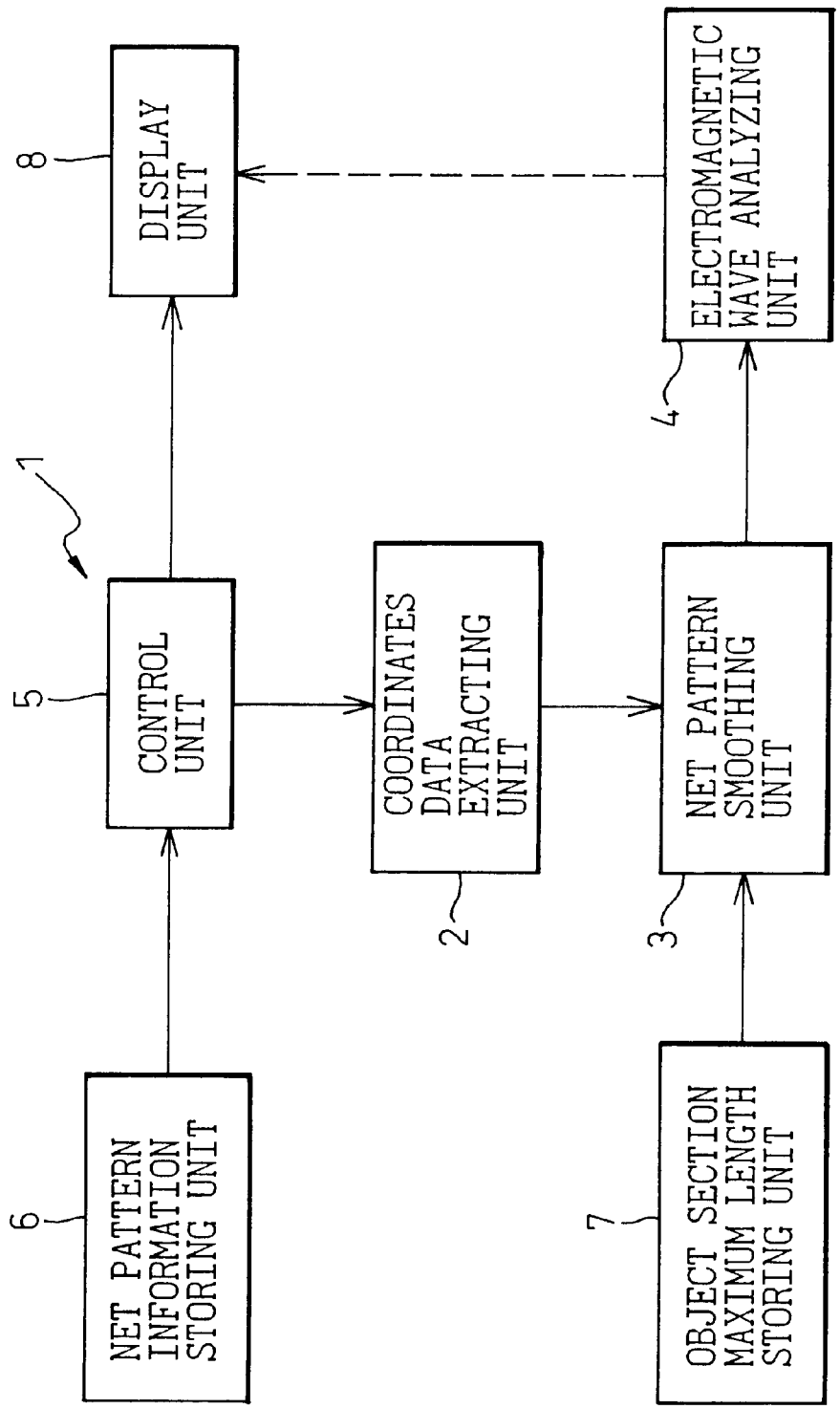
FIG. 2 is a block diagram showing the configuration of a basic embodiment based on the principle of the present invention.

FIG. 2 is a block diagram showing the configuration of the basic embodiment based on the principle of the present invention. The configuration of an electromagnetic wave analyzing apparatus 1 according to the basic embodiment of the present invention is shown here in a simplified form.

The electromagnetic wave analyzing apparatus 1 shown in FIG. 2 comprises an electromagnetic wave analyzing unit 4 for analyzing electromagnetic waves radiated from an appliance, on the basis of net pattern information concerning a net pattern obtained by modeling the appliance under analysis.

The electromagnetic wave analyzing apparatus 1 further comprises, as shown in FIG. 2, a coordinates data extracting unit 2 for extracting, from the net pattern information, coordinates data defining the coordinates of each of the terminal points of a plurality of segments constituting the net pattern; and a net pattern smoothing unit 3 for dividing the net pattern, based on the coordinates data extracted by the coordinates data extracting unit, into object sections each containing a prescribed number of segments so that the length of each of the object sections is not greater than a predetermined maximum length, and for carrying out smoothing of the net pattern (i.e., smoothing process) for each object section, by replacing the prescribed number of segments contained in each section with a single straight line or a plurality of straight lines smaller in number than the number of the segments.

In the electromagnetic wave analyzing apparatus 1, the coordinates data for which the smoothing process has been completed in the net pattern smoothing unit 3 is input to the electromagnetic wave analyzing unit 4 for calculation of the electromagnetic field intensity of the electromagnetic waves. The coordinates data extracting unit 2 and the net pattern smoothing unit 3 are essential components constituting an important feature of the present invention.

The electromagnetic wave analyzing apparatus 1 of FIG. 2 further comprises a net pattern information storing unit 6 for storing the net pattern information concerning the net pattern, and an object section maximum length storing unit 7 for storing the maximum length for each object section of the net pattern.

The electromagnetic wave analyzing apparatus 1 of FIG. 2 further comprises a control unit 2 for controlling the operation of the net pattern information storing unit 6, object section maximum length storing unit 7, coordinates data extracting unit 2, net pattern smoothing unit 3, and electromagnetic wave analyzing unit 4.

Preferably, the control unit 5 is constructed from a CPU (central processing unit) of a personal computer. To describe in further detail, the control unit 5 has the functions of reading out net pattern data from the net pattern information storing unit 6 and supplying it to the coordinates data extracting unit 2; reading out data indicating the object section maximum length from the object section maximum length storing unit 7 and supplying it to the net pattern smoothing unit 3; and supplying the net pattern data and a result of the electromagnetic wave analysis carried out by the electromagnetic wave analyzing unit 4 to a display unit 8 for display thereon.

Preferably, the net pattern smoothing unit 3 carries out the smoothing process for each object section by selecting an arbitrary intermediate point located between the coordinates of the start point of the object section and the coordinates of the end point thereof, and by setting the coordinates of the intermediate point so that the sum of the distance between the start point and the intermediate point and the distance between the intermediate point and the end point is equal to the combined length of the prescribed number of segments contained in the object section, and supplies the electromagnetic wave analyzing unit 4 with coordinates data containing the coordinates of the start point, intermediate point, and end point of the object section for which the smoothing process has been carried out.

Further, preferably, the net pattern smoothing unit 3 carries out the smoothing process for each object section, by replacing the prescribed number of segments contained in the object section with a straight line joining the start point and end point of the object section, and supplies the electromagnetic wave analyzing unit 4 with coordinates data containing the coordinates of the start point and end point of the object section for which the smoothing process has been carried out.

Further, preferably, the net pattern smoothing unit 3 carries out the smoothing process for each object section, by replacing the prescribed number of segments contained in the object section with two straight lines consisting of a first directional component and a second directional component joining the start point and end point of the object section, and supplies the electromagnetic wave analyzing unit 4 with coordinates data containing the coordinates of the start point and end point of the object section, for which the smoothing process has been carried out.

On the other hand, when operating the electromagnetic wave analyzing apparatus shown in FIG. 2 by using a computer readable storage medium, there is provided a storage medium having stored thereon means for extracting, from the net pattern information, coordinates data defining the coordinates of each of the terminal points of a plurality of segments constituting the net pattern; means for dividing the net pattern, based on the extracted coordinates data, into object sections each containing a prescribed number of segments so that the length of each of the object sections is not greater than a predetermined maximum length, and for carrying out smoothing of the net pattern for each object section, by replacing the prescribed number of segments contained in the object section with a single straight line or a plurality of straight lines smaller in number than the number of the segments; and means for calculating the electromagnetic field intensity of the electromagnetic waves, on the basis of the coordinates data for which the smoothing process has been carried out.

To recapitulate, in the basic embodiment of the present invention, the net pattern smoothing process is carried out for each of the object sections obtained by dividing the net pattern, by approximating the net pattern in each object section by the number of straight lines smaller than the number of segments contained in the object section.

To describe this in further detail, in a first specific smoothing method, an arbitrary intermediate point located between the start point and end point of the object section is selected, and the coordinates of the intermediate point are set so that the sum of the distance between the start point and the intermediate point and the distance between the intermediate point and the end point is equal to the combined length of the prescribed number of segments contained in the object section. In other words, this method carries out the net pattern smoothing process, by using a plurality of straight lines so that the length of the net pattern within each object section is not altered.

In a second specific smoothing method, the plurality of segments in the object section is replaced with a straight line joining the start point and end point of the object section. Further, the value of the current flowing in the network is calculated, based on the combined length of the plurality of segments contained in the object section, and the value of the current is distributed in an averaging method over the net pattern in order to prevent resonance points of the network from being altered.

In a third specific smoothing method, the plurality of segments in the object section is replaced with two straight lines consisting of a first directional component and a second directional component (for example, x directional and y directional components) joining the start point and end point of the object section. Further, the value of the current flowing in the network is calculated, based on the combined length of the plurality of segments contained in the object section, and the value of the current is distributed in an averaging method over the net pattern in order to prevent the resonance points of the network from being altered.

Thus, according to the basic embodiment of the present invention, since the number of segments can be reduced by carrying out the smoothing of the net pattern without substantially affecting the accuracy of electromagnetic wave analysis, the time required for the analysis of electromagnetic waves can be drastically reduced without degrading the accuracy of the electromagnetic wave analysis.

Figure 3:
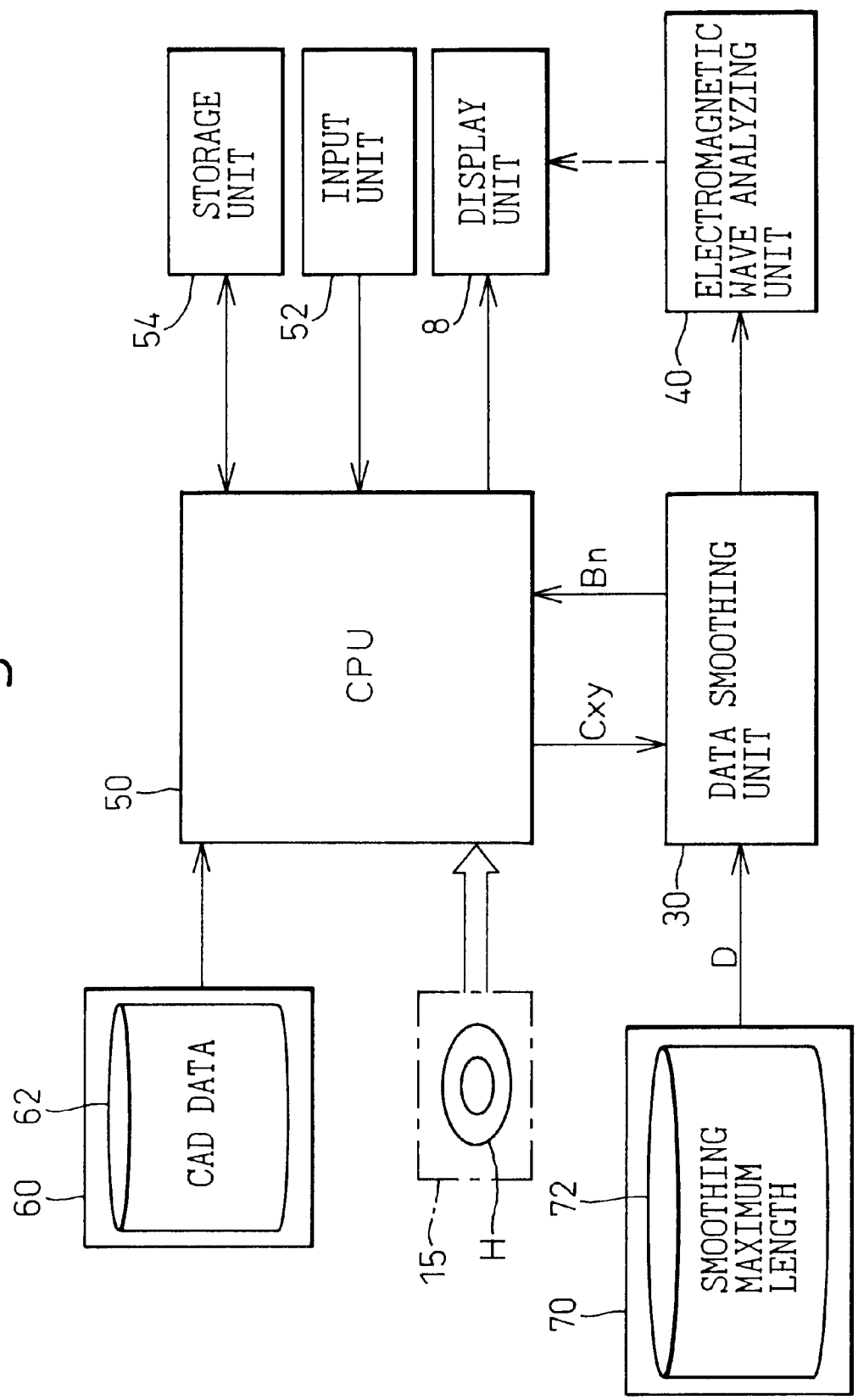
FIG. 3 is a block diagram showing the configuration of a preferred embodiment of the present invention.

FIG. 3 is a block diagram showing the configuration of a preferred embodiment of the present invention. In the description given hereinafter, the same constituent elements as those described above will be designated by the same reference numerals.

Figure 1:
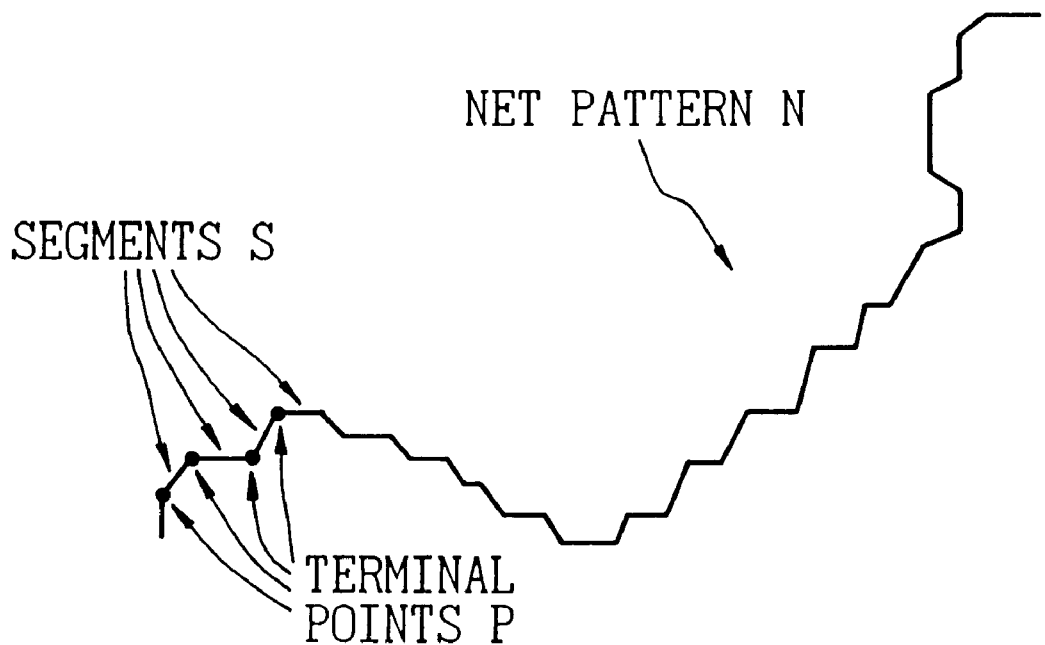
FIG. 1 is a schematic diagram showing one example of a prior art net pattern used for electromagnetic wave analysis.

The electromagnetic wave analyzing apparatus according to the preferred embodiment (hereinafter simply referred to as the embodiment) shown FIG. 3 comprises an electromagnetic wave analyzing unit 40 for analyzing electromagnetic waves radiated from an electronic appliance, on the basis of net pattern information concerning a net pattern obtained by modeling the electronic appliance. The electromagnetic wave analyzing unit 40 substantially corresponds to the electromagnetic wave analyzing unit 4 previously shown in FIG. 1, and is implemented using generally known electromagnetic wave analyzing software. Preferably, the electromagnetic wave analyzing unit 40 is implemented using a generally known electromagnetic wave analyzing program or the like. The following electromagnetic wave analyzing programs are commonly used today.

(1) ACCUFIELD (produced by Fujitsu Limited)
(2) EMC-WORKBENCH (produced by INCASE, Germany)
(3) QUIET (produced by VIEWlogic, Canada)

In the electromagnetic wave analyzing apparatus according to the embodiment of FIG. 3, the previously described control unit 5 and coordinates data extracting unit 2 (see FIG. 2) are both constructed from a CPU 5 of a personal computer. In other words, the control unit 5 and the coordinates data extracting unit 2 are both implemented using computer software. It is also possible to implement the control unit 5 and coordinates data extracting unit 2 by using workstation, UNIX, or other software.

The electromagnetic wave analyzing apparatus according to the embodiment of FIG. 3 further comprises a CAD data storing unit 62, which corresponds to the previously described net pattern information storing unit 6, and in which CAD data 62 created by using CAD is stored in advance. The CAD data storing unit 60 is constructed from a storage device such as a hard disk, optical disk, or magneto-optical disk, and stores thereon various kinds of CAD data 62 relating to the net patterns of the electronic appliance on which the analysis of electromagnetic waves is to be performed. CAD systems commonly used today include:

(1) ICAD/PCB (produced by Fujitsu Limited)
(2) CR5000, VISULA (produced by Zuken Inc.)
(3) VERIBEST (produced by Mentor Graphics Japan)

The electromagnetic wave analyzing apparatus according to the embodiment of FIG. 3 further comprises a smoothing maximum length data storing unit 70, which corresponds to the previously described object section maximum length storing unit 7, and in which smoothing maximum length data 72 defining the maximum length for the object section concerned is set and stored in advance when carrying out the smoothing of net pattern data for each object section. The smoothing maximum length data storing unit 70 also is constructed from a storage device such as a hard disk, optical disk, or magneto-optical disk.

Furthermore, in the embodiment of FIG. 3, when storing the smoothing maximum length data in advance by using a computer readable storage medium, it is preferable to use a storage medium whose contents can be altered as needed, for example, a hard disk, for storing the smoothing maximum length data.

The CPU 5 has the functions of reading out the CAD data from the CAD data storing unit 62 and extracting from the CAD data the coordinates data Cxy defining the coordinates of the terminal points of each of the plurality of segments constituting the net pattern; reading out the smoothing maximum length data 72 from the smoothing maximum length data storing unit 70 and supplying it to the data smoothing unit 30 described hereinafter; and supplying the net pattern data and the result of the electromagnetic wave analysis to the display unit 8 for display thereon.

The electromagnetic wave analyzing apparatus according to the embodiment of FIG. 3 further comprises the data smoothing unit 30 for carrying out the smoothing of the net pattern data by using the net pattern coordinates data Cxy. The data smoothing unit 30 substantially corresponds to the net pattern smoothing unit 3 previously shown in FIG. 2, and is implemented using computer software, as in the case of the control unit 5 and coordinates data extracting unit 2.

To describe this in further detail, the data smoothing unit 30 divides the net pattern into a plurality of object sections, based on the net pattern coordinates data Cxy extracted from the CAD data 62, in such a manner that the length of each object section does not exceed the smoothing maximum length defined by the smoothing maximum length data, and changes the path of the net pattern for each object section by replacing the plurality of segments contained in the object section with a single or a plurality of straight lines smaller in number than the number of the segments. The coordinates data that has been processed by the data smoothing unit 30 is supplied to the electromagnetic wave analyzing unit 40 by which the electromagnetic field intensity of the electromagnetic wave is easily calculated.

The electromagnetic wave analyzing apparatus according to the embodiment of FIG. 3 further comprises a storage unit 54 for temporarily storing the net pattern coordinates data Cxy and whole net length data defining the actual whole net length Bn of the net pattern of each object section. Besides, the storage unit 54 has the function of storing a smoothing program for implementing the smoothing process of the present invention. The storage unit 54 is constructed from a RAM (random access memory) or a ROM (read only memory). Alternatively, a RAM or ROM internal to the CPU 50 may be used as the storage unit 54.

To describe this in further detail, the smoothing program includes the steps of: extracting from the CAD data the coordinates data defining the coordinates of each of the plurality of terminal points constituting the net pattern; dividing the net pattern into a plurality of object sections, based on the extracted coordinates data, in such a manner that the length of each object section does not exceed the smoothing maximum length defined by the smoothing maximum length data, and carrying out the smoothing of the net pattern data for each object section, by replacing the plurality of segments contained in the object section with a single or a plurality of straight lines smaller in number than the number of the segments; and calculating the electromagnetic field intensity of the electromagnetic waves, on the basis of the coordinates data for which the smoothing has been completed.

Furthermore, in the embodiment of FIG. 3, when operating the electromagnetic wave analyzing apparatus by using a computer readable storage medium, it is preferable to provide a storage medium, for example, a hard disk H, that stores the contents of a smoothing program such as described above. The hard disk H is driven by means of a hard disk drive unit 15.

The electromagnetic wave analyzing apparatus according to the embodiment of FIG. 3 further comprises an input unit 52 used to input various kinds of data relating to the net pattern information of the electronic appliance under analysis. The input unit 52 is preferably constructed from a mouse, keyboard, or the like.

According to the embodiment of FIG. 3, since the number of segments within each object section is reduced by carrying out the smoothing process on the net pattern data so as not to affect the accuracy of electromagnetic wave analysis, the time required to calculate the electromagnetic field intensity of the electromagnetic waves can be drastically reduced without degrading the accuracy of the electromagnetic wave analysis.

The following two requirements are important considerations in preventing the degradation of the accuracy of the electromagnetic wave analysis.

Requirement (1) . . . Since electromagnetic radiation is particularly strong at each resonance point of the net pattern, the resonance point after the smoothing is made to coincide with the resonance point before the smoothing.

Requirement (2) . . . Provision is made to prevent the direction of electromagnetic radiation after the smoothing from being altered substantially.

For specific measures for satisfying the above two requirements, smoothing methods such as listed (a) to (c) below (described in detail later with reference to FIGS. 4 to 9) are considered.

(a) To satisfy the above requirements (1) and (2), provision is made so that the whole length of the net pattern in each object section will not be altered if smoothing is done (first smoothing process).

(b) If the smoothing process of (a) is not possible, the plurality of segments in the object section are replaced with a straight line joining the start point and end point of the object section and, based on the combined length of the first plurality of segments (that is, the original transmission line), the value of the current flowing in the transmission line is calculated and the value of the current is distributed in an averaging method over the net pattern to prevent the resonance point of the net pattern constructed by the straight line from being altered (second smoothing process).

Alternatively, to prevent the resonance point of the net pattern from being altered, the value of the current flowing in the transmission line is calculated by altering a dielectric constant (medium) of a dielectric, or a capacitor is inserted at the terminating end of the transmission line.

(c) If the smoothing process of (a) is not possible, the plurality of segments in the object section are replaced with two straight lines consisting of x directional and y directional components joining the start point and end point of the object section and, based on the original transmission line, the value of the current flowing in the transmission line is calculated and this current value is distributed in an averaging method over the net pattern to prevent the resonance point of the net pattern constructed by the straight lines from being altered (third smoothing process).

Figure 4:
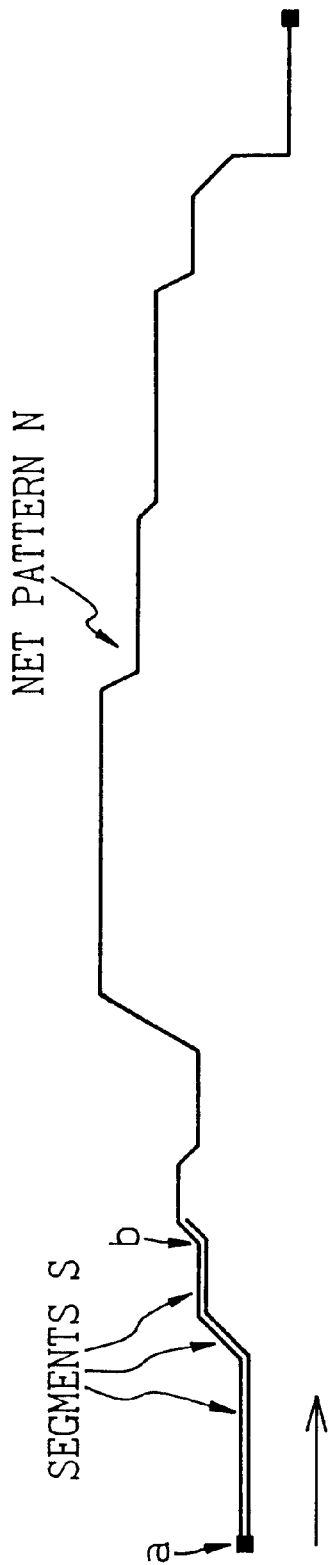
FIG. 4 is a schematic diagram showing how a net pattern applied to the embodiment of the present invention is divided into a plurality of object sections.

FIG. 4 is a schematic diagram showing how the net pattern applied to the embodiment of the present invention is divided into a plurality of object sections. Here, assuming that a wiring pattern on a printed circuit board in an electronic appliance is selected as the net pattern N obtained by modeling the electronic appliance under analysis, a description will be given as to how the wiring pattern is divided into a plurality of object sections.

When dividing the net pattern N shown in FIG. 4 into a plurality of object sections, first, a retrieval process is carried out, starting from a terminal point (terminal point "a") of the net pattern N and working toward another terminal point (or a branch point) lying in the same layer. Starting from the terminal point "a", the length of each segment S is added sequentially, and the retrieval process is stopped at a terminal point "b" corresponding to the position just before the position exceeding the predetermined smoothing maximum length (for example, 1 cm). Further, the plurality of segments contained in the section between the terminal point "a" and the terminal point "b" are taken to form one object section (between "a" and "b" in FIG. 4) for which the path is to be changed. The above net pattern retrieval process is repeated, this time starting from the terminal point "b" and working toward another terminal point; by repeating this net pattern retrieval process over the entire length of the net pattern, the entire net pattern is divided into a plurality of object sections. Smoothing of the data of the net pattern N is carried out for each object section by replacing the plurality of segments contained in the object section with a single straight line or a plurality of straight lines smaller in number than the number of the segments.

Figure 5:
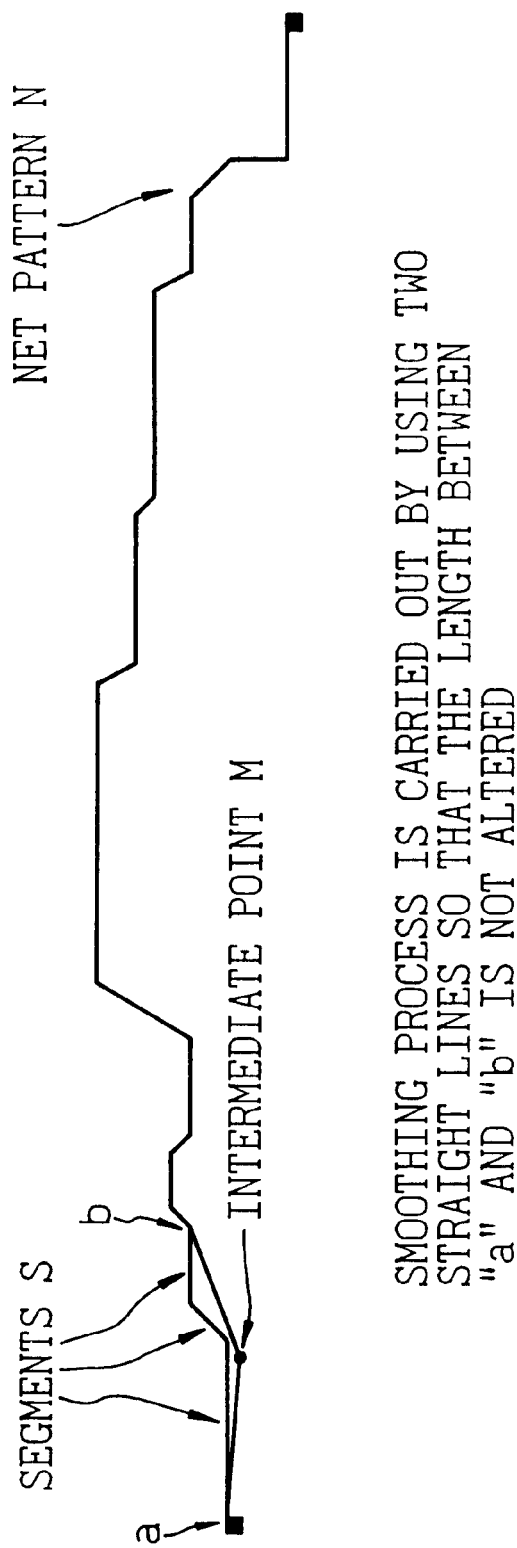
FIG. 5 is a schematic diagram showing how a first smoothing process is carried out on the net pattern applied to the embodiment of the present invention.

FIG. 5 is a schematic diagram showing how the first smoothing process is carried out on the net pattern applied to the embodiment of the present invention.

In the first smoothing process, the smoothing process between "a" and "b" is carried out by using two straight lines in such a manner as to retain the combined length of the plurality of segments contained in one object section (between "a" and "b") that has been determined by carrying out the above net pattern retrieval process (see FIG. 4).

More specifically, an arbitrary intermediate point "c" is selected that lies between the coordinates of the start point (terminal point "a") of one target section (between "a" and "b") and the coordinates of the end point (terminal point "b") thereof. Further, the coordinates of the intermediate point "c" are determined so that the sum of the lengths of the two straight lines joining the terminal point "a", the intermediate point "c", and the terminal point "b", becomes equal to the combined length of the plurality of segments contained in that object section. In this case, it is preferable that the two straight lines joining the terminal point "a", the intermediate point "c", and the terminal point "b" be made equal in length by taking the intermediate point "c" at a position equidistant from both the terminal points "a" and "b" of the object section (the thus selected intermediate point is called the "middle point").

To describe this in further detail, when the coordinates of the terminal points "a" and "b" are designated by (xa, ya) and (xb, yb), respectively, the intermediate point "c" is defined at (xc, yc), and the terminal point "a", the intermediate point "c", and the terminal point "b" are joined by using two straight lines.

From the whole length of the net pattern between "a" and "b", the values of xc and yc are found by the following equations.

$$xc = xa + \frac{A\cos(\theta_1 + \theta_2)}{2} \quad yc = ya + \frac{A\sin(\theta_1 + \theta_2)}{2}$$

where $\theta_1$ and $\theta_2$ are expressed as $$\theta_1 = \cos^{-1}\sqrt{\frac{(xb-xa)^2 + (yb-ya)^2}{A}} \quad \theta_2 = \tan^{-1}\frac{yb-ya}{xb-xa}$$

Then, the plurality of segments are replaced with the two straight lines joining the terminal point "a", the intermediate point "c", and the terminal point "b", to complete the smoothing process for the net pattern in that object section.

Figure 6:
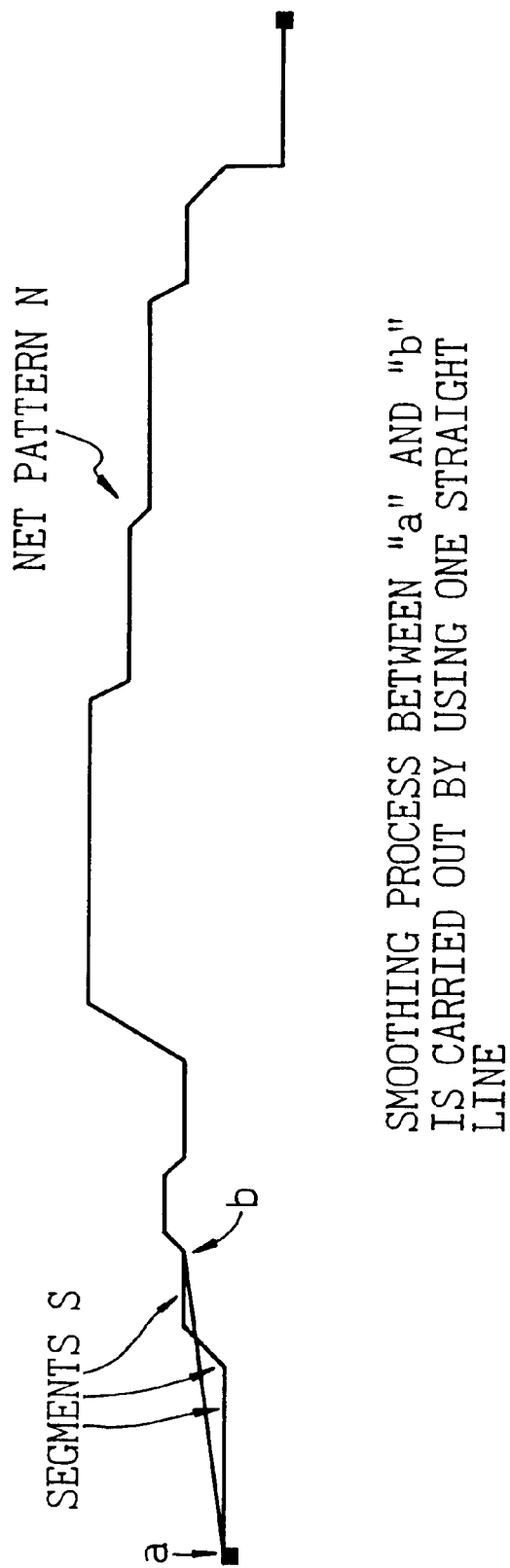
FIG. 6 is a schematic diagram showing how a second smoothing process is carried out on the net pattern applied to the embodiment of the present invention.

FIG. 6 is a schematic diagram showing how the second smoothing process is carried out on the net pattern applied to the embodiment of the present invention, and FIG. 7 is a graph showing the relationship between the impedance and electric field intensity of the net pattern.

In the second smoothing process, the smoothing process between "a" and "b" is carried out by using a single straight line directly joining the start point (terminal point "a") and end point (terminal point "b") of one object section (between "a" and "b").

That is, the smoothing process between "a" and "b" is carried out by replacing the plurality of segments S contained in one object section (between "a" and "b") with a straight line joining the terminal points "a" and "b" of the object section.

For a net pattern in a given object section, resonance points occur at or near natural frequencies (for example, 200 MHz and 700 MHz) as can be seen from the upper graph in FIG. 7 showing the relationship between frequency and impedance. Since the radiation of electromagnetic waves is particularly strong at these resonance points, the absolute value of the electric field intensity is large at the corresponding points as can be seen from the lower graph in FIG. 7 showing the relationship between frequency and electric field intensity. Therefore, to accurately calculate the electric field intensity of the electromagnetic waves being radiated from an electronic appliance, it is particularly important that the resonance points after the smoothing be made to coincide with the resonance points before the smoothing.

However, in the smoothing process shown in FIG. 6, the length of the object section after the smoothing (that is, the length of the straight line joining "a" and "b") becomes shorter than the actual length of the object section before the smoothing (that is, the combined length of the plurality of segments S contained in the section between "a" and "b"). In other words, when the whole length of the net pattern (whole net length) in the object section after the smoothing is denoted by Cn, and the actual whole length of the net pattern (actual whole net length) in the object section, stored before the smoothing, is denoted by Bn, the whole net length after the smoothing is shorter than the actual whole net length by the length of Bn-Cn. As a result, the resonance points of the net pattern in the object section are shifted to higher frequencies. To correct for such shifting of the resonance points, the value of the current flowing in the net pattern is calculated, based on the combined length of the plurality of segments contained in the section between "a" and "b" (for example, the original transmission line), and the value of the current is distributed in an averaging method over the net pattern. Since this serves to prevent the resonance points from shifting, errors in the electric field of the electromagnetic waves, which may occur due to the smoothing process, can be suppressed.

Other measures for correcting the shifting of the net pattern resonance points will be considered below. As one measure, a dielectric constant of the dielectric used for the transmission line in the net pattern is set to be larger than the specified dielectric constant, causing the resonance points of the net pattern to shift to lower frequencies and, in this condition, the value of the current flowing in the transmission line is calculated; in this way, the resonance points can be prevented from being altered.

As another measure for correcting the shifting of the resonance points, a capacitor is inserted at the terminating end of the transmission line, causing the resonance points of the net pattern to shift to lower frequencies. This also serves to prevent the resonance points from being altered.

FIG. 8 is a schematic diagram showing how the net pattern applied to the embodiment of the present invention is decomposed into x directional and y directional components, and FIG. 9 is a schematic diagram showing how the third smoothing process is carried out on the net pattern applied to the embodiment of the present invention.

AS shown in FIG. 8, the net pattern N can be decomposed into components of two mutually perpendicular directions such as x and y directions. In the third smoothing process, the net pattern N is first decomposed into the x directional and y directional components and, as shown in FIG. 9, the smoothing process between "a" and "b" is carried out, by using two straight lines consisting of the x directional and y directional components joining the start point (terminal point "a") and end point (terminal point "b") of one object section (between "a" and "b").

That is, the smoothing process between "a" and "b" is carried out by replacing the plurality of segments S contained in one object section (between "a" and "b") with the two straight lines consisting of the x directional and y directional components joining the terminal points "a" and "b" of that object section. In this case, by carrying out the third smoothing process along each of the x and y directions, the electric field intensity of the electromagnetic waves can be calculated with higher accuracy than in the case of the second smoothing process (see FIG. 6).

However, the third smoothing process also involves the same problem as that encountered in the second smoothing process, that is, the resonance points of the net pattern in the object section shift to higher frequencies. To correct such shifting of the net pattern resonance points, the value of the current flowing in the net pattern is calculated for the x and y directions, based on the combined length of the plurality of segments contained in the section between "a" and "b", and the value of the current is distributed by an averaging method over the net pattern, similar to the case of the second smoothing process (see FIG. 6).

Alternatively, as in the second smoothing process, the value of the current flowing in the transmission line is calculated by altering the dielectric constant of the dielectric in the net pattern, or a capacitor is inserted at the terminating end of the transmission line.

Figure 10B:
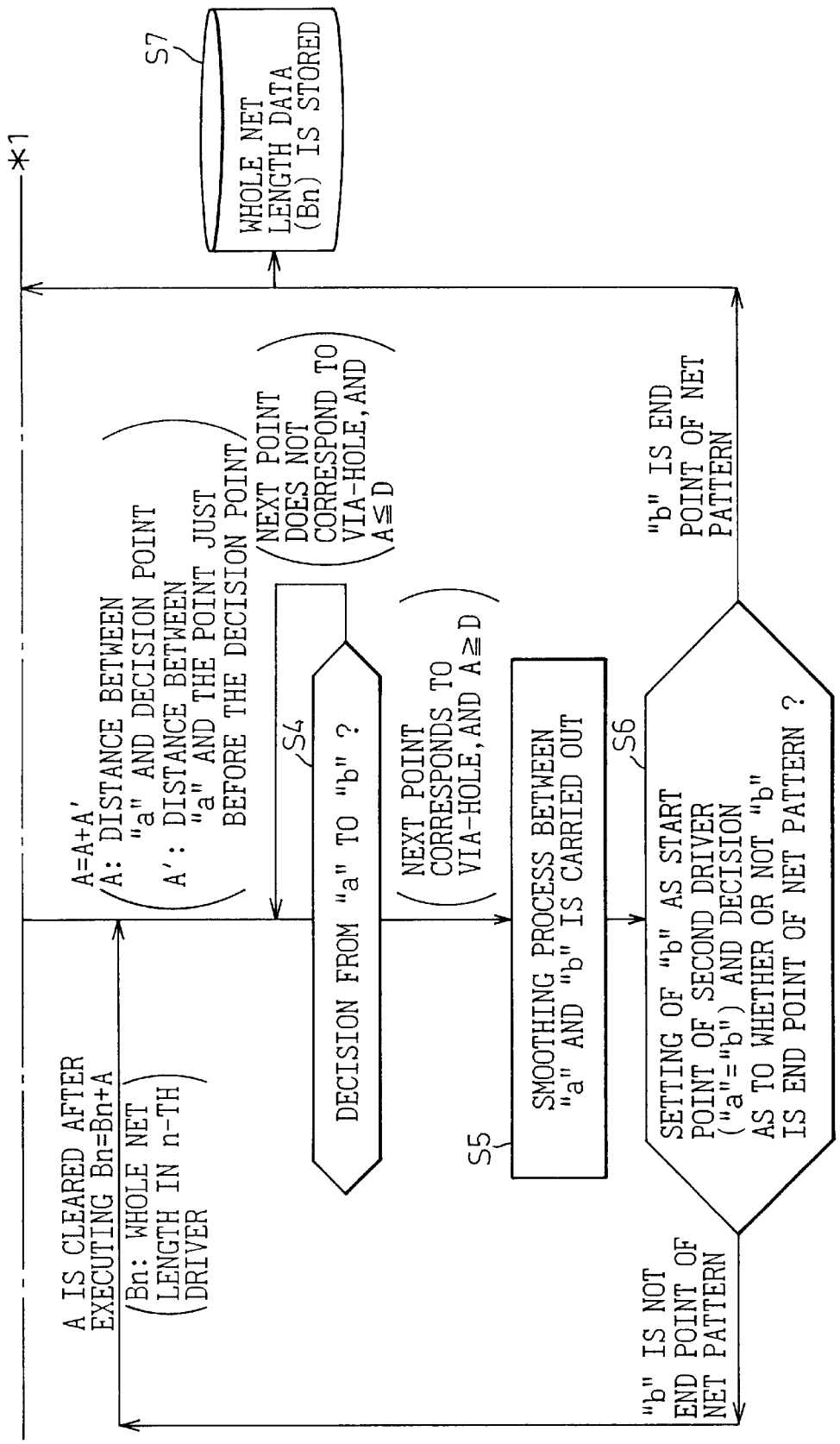

FIGS. 10(A) and 10(B) are flowcharts each for explaining a procedure for carrying out the smoothing process according to the embodiment of the present invention. The following explanation deals with the process steps carried out by the CPU 50 and data smoothing unit 30 previously shown in FIG. 3 when carrying out the analysis of an electromagnetic waves, based on the net pattern obtained by modeling an electronic appliance.

As shown in the flowchart of FIG. 10(A), the process starts by reading out the smoothing maximum length data D set and stored in advance in the storage unit such as a hard disk, RAM, or ROM (step S1).

Next, retrieval of drivers constituting the net pattern is carried out, starting from a given terminal point (terminal point "a") within the net pattern and working toward another terminal point (terminal point "b") lying in the same layer (step S2). Further, the given terminal point "a" within the net pattern is set as the start point "a" of a first driver (driver 1) (step S3).

Then, as shown in FIG. 10(B), when carrying out a decision from the start point "a" to the next terminal point "b", the length of each segment is sequentially added, starting from the start point "a" of the first driver, as long as the following conditions are satisfied; namely, the condition that the terminal point "b" does not correspond to a via-hole (also called a through-hole) (that is, the condition that the terminal point "b" lies within the same layer in the printed circuit board), and the condition that the combined length of the plurality of segments is not greater than the length defined by the smoothing maximum length data D. When the distance from the start point "a" to the decision point obtained as a result of the decision carried out from the start point "a" to the next terminal point "b" is denoted by A, and the distance to the terminal point just before the decision point is denoted by A', then the above decision process is represented by A=A+A' (step S4).

When the next terminal point "b" corresponds to a via-hole and the net pattern moves to another layer in the printed circuit board, or when the distance A corresponding to the combined length of the plurality of segments reaches or exceeds the length defined by the smoothing maximum length data D, retrieval of the first driver is stopped, and the plurality of segments contained in the section from the terminal point "a" to the terminal point "b" are taken as one object section (between "a" and "b") for which the path is to be changed. The first driver carries out the smoothing process between "a" and "b" by replacing the plurality of segments contained in that one object section with a single straight line or a plurality of straight lines smaller in number than the number of the segments (step S5).

Next, the terminal point "b" is set as the start point "a" (terminal point "a"=terminal point "b"), that is, the start point "a" of a second driver (driver 2), and a decision is made as to whether or not a new terminal point "b" is the end point of the net pattern (step S6).

As long as the terminal point "b" is not judged to be the end point of the net pattern, the process from step S4 to step S6 is repeated by operating the n-th driver (driver n, where n is a positive integer). When the actual whole net length in one given object section is denoted by Bn, the whole net length at the time that the smoothing process is carried out by operating the n-th driver is given by the relation Bn=Bn+A.

When the terminal point "b" is judged to be the end point of the net pattern, the final whole net length Bn is calculated by clearing the value of A in Bn=Bn+A. The whole net length data corresponding to this whole net length Bn is stored in the storage unit such as a hard disk, RAM, or ROM (step S7).

The process from step S2 to step S7 is carried out repeatedly until the retrieval of all the drivers in the electronic appliance under analysis is completed.

As described above, according to the basic embodiment and preferred embodiment of the present invention, for each object section obtained by dividing a network the net pattern smoothing process is carried out by approximating the net pattern in the object section by a straight line or straight lines smaller in number than the number of the segments contained in the object section. As a result, since the number of segments can be reduced by carrying out the smoothing process within the net pattern so as not to affect the accuracy of electromagnetic wave analysis, the time required for the analysis of electromagnetic waves can be drastically reduced without degrading the accuracy of the electromagnetic wave analysis.

What is claimed is:

1. An electromagnetic wave analyzing apparatus having an electromagnetic wave analyzing unit for analyzing electromagnetic waves radiated from an appliance, on the basis of net pattern information concerning a net pattern obtained by modeling said appliance under analysis, said apparatus comprising:

a coordinates data extracting unit for extracting, from said net pattern information, coordinates data defining the coordinates of each of terminal points of a plurality of segments constituting said net pattern; and a net pattern smoothing unit for dividing said net pattern, based on the coordinates data extracted by said coordinates data extracting unit, into object sections each containing a prescribed number of segments so that the length of each of said object sections is not greater than a predetermined maximum length, and for carrying out smoothing of said net pattern for each object section, by replacing said prescribed number of segments contained in said object section with a single straight line or a plurality of straight lines smaller in number than the number of said segments, wherein, the coordinates data on which said smoothing has been completed is input to said electromagnetic wave analyzing unit for calculation of the electromagnetic field intensity of said electromagnetic waves, wherein said net pattern smoothing unit carries out said smoothing for said each object section by selecting an arbitrary intermediate point located between coordinates defining a start point of said object section and coordinates defining an end point thereof, and by setting the coordinates of said intermediate point so that the sum of the distance between said start point and said intermediate point and the distance between said intermediate point and said end point is equal to the combined length of said prescribed number of segments contained in said object section, and the coordinate data containing the coordinates of said start point, said intermediate point, and said end point of said object section, for which said smoothing has been completed, is input to said electromagnetic wave analyzing unit.

2. An electromagnetic wave analyzing apparatus as claimed in claim 1, wherein said intermediate point is taken at a position equidistant from both of said start point and said end point of said object section.

3. An electromagnetic wave analyzing apparatus as claimed in claim 1, wherein, in order to prevent a resonance point of said net pattern from being altered as a result of said smoothing, the value of a current flowing in said net pattern is calculated, based on the combined length of said prescribed number of segments contained in said object section.

4. An electromagnetic wave analyzing apparatus as claimed in claim 1, wherein, in order to prevent a resonance point of said net pattern from being altered as a result of said smoothing, the value of a current flowing in said net pattern is calculated by altering a dielectric constant of said net pattern.

5. An electromagnetic wave analyzing apparatus as claimed in claim 1, wherein a capacitor is inserted at a terminating end of said net pattern in order to prevent a resonance point of said net pattern from being altered as a result of said smoothing.

6. A computer readable storage medium, said storage medium having stored therein computer-executable instructions to perform a process for analyzing electromagnetic waves radiated from an appliance, on the basis of net pattern information concerning a net pattern obtained by modeling said appliance under analysis, the process comprising:

extracting, from said net pattern information, coordinates data defining the coordinates of each of terminal points of a plurality of segments constituting said net pattern; and dividing said net pattern, based on said extracted coordinates data extracted, into object sections each containing a prescribed number of segments so that the length of each of said object sections is not greater than a predetermined maximum length, and for carrying out smoothing of said net pattern for each object section, by replacing said prescribed number of segments contained in said object section with a single straight line or a plurality of straight lines smaller in number than the number of said segments; and wherein coordinate data on which said smoothing has been completed is used to calculate an electromagnetic field intensity of said electromagnetic waves, and wherein said net pattern smoothing is carried out for said each object section by one of:

selecting an arbitrary intermediate point located between coordinates defining a start point of said object section and coordinates defining an end point thereof, and by setting the coordinates of said intermediate point so that the sum of the distance between said start point and said intermediate point and the distance between said intermediate point and said end point is equal to the combined length of said prescribed number of segments contained in said object section, and the coordinate data containing the coordinates of said start point, said intermediate point, and said end point of said object section, for which said smoothing has been completed, is analyzed;

replacing said prescribed number of segments contained in said object section with a straight line joining the start point and end point of said object section, and the coordinate data containing the coordinates of said start point and said end point of said object section, for which said smoothing has been completed, is analyzed; and replacing said prescribed number of segments contained in said object section with two straight lines consisting of a first directional component and a second directional component joining the start point and end point of said object section, and the coordinate data containing the coordinates of said start point and said end point of said object section, for which said smoothing has been completed, is analyzed.

7. A computer readable storage medium as claimed in claim 6, wherein said storage medium stores thereon data that defines the maximum length of each object section and that can be altered as needed, said data being used when carrying out the smoothing of said net pattern for said each object section by dividing said net pattern, obtained by modeling said appliance under analysis, into said object sections each containing said prescribed number of segments.

8. An electromagnetic wave analyzing method for analyzing electromagnetic waves radiated from an appliance, on the basis of net pattern information concerning a net pattern obtained by modeling said appliance under analysis, said method comprising:

extracting, from said net pattern information, coordinates data defining the coordinates of each of terminal points of a plurality of segments constituting said net pattern;

dividing said net pattern, based on said extracted coordinates data, into object sections each containing a prescribed number of segments so that the length of each of said object sections is not greater than a predetermined maximum length, and carrying out smoothing of said net pattern for each object section by selecting an arbitrary intermediate point located between coordinates defining a start point of said each object section and coordinates defining an end point thereof, and by setting the coordinates of said intermediate point so that the sum of the distance between said start point and said intermediate point and the distance between said intermediate point and said end point is equal to the combined length of said prescribed number of segments contained in said object section; and calculating the electromagnetic field intensity of said electromagnetic waves, on the basis of the coordinates data containing the coordinates of said start point, said intermediate point, and said end point of said object section, for which said smoothing has been completed.

9. An electromagnetic wave analyzing method for analyzing electromagnetic waves radiated from an appliance, on the basis of net pattern information concerning a net pattern obtained by modeling said appliance under analysis, said method comprising:

extracting, from said net pattern information, coordinates data defining the coordinates of each of terminal points of a plurality of segments constituting said net pattern;

dividing said net pattern, based on said extracted coordinates data, into object sections each containing a prescribed number of segments so that the length of each of said object sections is not greater than a predetermined maximum length, and carrying out smoothing of said net pattern for each object section, by replacing said prescribed number of segments contained in said each object section with a straight line joining the start point and end point of said object section; and calculating the electromagnetic field intensity of said electromagnetic waves, on the basis of the coordinates data containing the coordinates of said start point and said end point of said object section, for which said smoothing has been completed.

10. An electromagnetic wave analyzing method for analyzing electromagnetic waves radiated from an appliance, on the basis of net pattern information concerning a net pattern obtained by modeling said appliance under analysis, said method comprising:

extracting, from said net pattern information, coordinates data defining the coordinates of each of terminal points of a plurality of segments constituting said net pattern;

dividing said net pattern, based on said extracted coordinates data, into object sections each containing a prescribed number of segments so that the length of each of said object sections is not greater than a predetermined maximum length, and carrying out smoothing of said net pattern for each object section, by replacing said prescribed number of segments contained in said each object section with two straight lines consisting of a first directional component and a second directional component joining the start point and end point of said object section; and calculating the electromagnetic field intensity of said electromagnetic waves, on the basis of the coordinates data containing the coordinates of said start point and said end point of said object section, for which said smoothing has been completed.

11. An electromagnetic wave analyzing apparatus having an electromagnetic wave analyzing unit for analyzing electromagnetic waves radiated from an appliance, on the basis of net pattern information concerning a net pattern obtained by modeling said appliance under analysis, said apparatus comprising:

a coordinate data extracting unit for extracting, from said net pattern information, coordinate data defining the coordinates of each of terminal points of a plurality of segments constituting said net pattern; and a net pattern smoothing unit for dividing said net pattern, based on the coordinate data extracted by said coordinate data extracting unit, into object sections each containing a prescribed number of segments so that the length of each of said object sections is not greater than a predetermined maximum length, and for carrying out smoothing of said net pattern for each object section, by replacing said prescribed number of segments contained in said object section with a single straight line or a plurality of straight lines smaller in number than the number of said segments, wherein the coordinate data on which said smoothing has been completed is input to said electromagnetic wave analyzing unit for calculation of the electromagnetic field intensity of said electromagnetic waves, and wherein said net pattern smoothing unit carries out said smoothing for said each object section by one of:

determining coordinates of an arbitrary intermediate point located between a start point of said object section and an end point thereof, so that the sum of the distance between said start point and said intermediate point and the distance between said intermediate point and said end point is equal to the combined length of said prescribed number of segments contained in said object section;

replacing said prescribed number of segments contained in said object section with a straight line joining the start point and end point of said object section; and replacing said prescribed number of segments contained in said object section with two straight lines consisting of a first directional component and a second directional component joining the start point and end point of said object section; and analyzing the coordinate data containing coordinates of said start point and said end point of said object section, for which said smoothing has been completed.

12. An electromagnetic wave analyzing apparatus having an electromagnetic wave analyzing unit for analyzing electromagnetic waves radiated from an appliance, on the basis of net pattern information concerning a net pattern obtained by modeling said appliance under analysis, said apparatus comprising:

a coordinates data extracting unit for extracting, from said net pattern information, coordinates data defining the coordinates of each of terminal points of a plurality of segments constituting said net pattern; and a net pattern smoothing unit for dividing said net pattern, based on the coordinates data extracted by said coordinates data extracting unit, into object sections each containing a prescribed number of segments so that the length of each of said object sections is not greater than a predetermined maximum length, and for carrying out smoothing of said net pattern for each object section, by replacing said prescribed number of segments contained in said object section with a single straight line or a plurality of straight lines smaller in number than the number of said segments, wherein the coordinates data on which said smoothing has been completed is input to said electromagnetic wave analyzing unit for calculation of the electromagnetic field intensity of said electromagnetic waves, and wherein said net pattern smoothing unit carries out said smoothing for said each object section by replacing said prescribed number of segments contained in said object section with a straight line joining the start point and end point of said object section, and the coordinate data containing the coordinates of said start point and said end point of said object section, for which said smoothing has been completed, is input to said electromagnetic wave analyzing unit.

13. An electromagnetic wave analyzing apparatus as claimed in claim 12, wherein, in order to prevent a resonance point of said net pattern from being altered as a result of said smoothing, the value of a current flowing in said net pattern is calculated, based on the combined length of said prescribed number of segments contained in said object section.

14. An electromagnetic wave analyzing apparatus as claimed in claim 12, wherein, in order to prevent a resonance point of said net pattern from being altered as a result of said smoothing, the value of a current flowing in said net pattern is calculated by altering a dielectric constant of said net pattern.

15. An electromagnetic wave analyzing apparatus as claimed in claim 12, wherein a capacitor is inserted at a terminating end of said net pattern in order to prevent a resonance point of said net pattern from being altered as a result of said smoothing.

16. An electromagnetic wave analyzing apparatus having an electromagnetic wave analyzing unit for analyzing electromagnetic waves radiated from an appliance, on the basis of net pattern information concerning a net pattern obtained by modeling said appliance under analysis, said apparatus comprising:

a coordinates data extracting unit for extracting, from said net pattern information, coordinates data defining the coordinates of each of terminal points of a plurality of segments constituting said net pattern; and a net pattern smoothing unit for dividing said net pattern, based on the coordinates data extracted by said coordinates data extracting unit, into object sections each containing a prescribed number of segments so that the length of each of said object sections is not greater than a predetermined maximum length, and for carrying out smoothing of said net pattern for each object section, by replacing said prescribed number of segments contained in said object section with a single straight line or a plurality of straight lines smaller in number than the number of said segments, wherein the coordinates data on which said smoothing has been completed is input to said electromagnetic wave analyzing unit for calculation of the electromagnetic field intensity of said electromagnetic waves, and wherein said net pattern smoothing unit carries out said smoothing for said each object section by replacing said prescribed number of segments contained in said object section with two straight lines consisting of a first directional component and a second directional component joining the start point and end point of said object section, and the coordinate data containing the coordinates of said start point and said end point of said object section, for which said smoothing has been completed, is input to said electromagnetic wave analyzing unit.

17. An electromagnetic wave analyzing apparatus as claimed in claim 16, wherein, in order to prevent a resonance point of said net pattern from being altered as a result of said smoothing, the value of a current flowing in said net pattern is calculated, based on the combined length of said prescribed number of segments contained in said object section.

18. An electromagnetic wave analyzing apparatus as claimed in claim 16, wherein, in order to prevent a resonance point of said net pattern from being altered as a result of said smoothing, the value of a current flowing in said net pattern is calculated by altering a dielectric constant of said net pattern.

19. An electromagnetic wave analyzing apparatus as claimed in claim 16, wherein a capacitor is inserted at a terminating end of said net pattern in order to prevent a resonance point of said net pattern from being altered as a result of said smoothing.

* * * * *